(12) United States Patent
Mori et al.

(10) Patent No.: US 7,781,861 B2
(45) Date of Patent: Aug. 24, 2010

(54) SEMICONDUCTOR DEVICE

(75) Inventors: Hideki Mori, Kanagawa (JP); Hirokazu Ejiri, Kanagawa (JP); Kenji Azami, Kanagawa (JP); Terukazu Ohno, Kanagawa (JP); Nobuyuki Yoshitake, Kanagawa (JP)

(73) Assignee: Sony Corporation, Tokyo (JP)

( * ) Notice: Subject to any disclaimer, the term of this patent is extended or adjusted under 35 U.S.C. 154(b) by 907 days.

(21) Appl. No.: 10/550,796

(22) PCT Filed: Mar. 30, 2004

(86) PCT No.: PCT/JP2004/004490

§ 371 (c)(1),
(2), (4) Date: Sep. 22, 2005

(87) PCT Pub. No.: WO2004/088747

PCT Pub. Date: Oct. 14, 2004

(65) Prior Publication Data

US 2006/0263986 A1    Nov. 23, 2006

(30) Foreign Application Priority Data

Mar. 31, 2003 (JP) .............................. 2003-096093

(51) Int. Cl.
H01L 23/62  (2006.01)
(52) U.S. Cl. ................ 257/529; 257/665; 257/E23.149
(58) Field of Classification Search .................. 257/529, 257/665, E23.149
See application file for complete search history.

(56) References Cited

U.S. PATENT DOCUMENTS 5,708,291 A  *  1/1998  Bohr et al. .................. 257/529

FOREIGN PATENT DOCUMENTS

| JP | 04-290458 | 10/1992 |
| JP | 04-373147 | 12/1992 |
| JP | 05-041481 | 2/1993 |
| JP | 07-122646 | 5/1995 |
| JP | 11-512879 | 11/1999 |
| JP | 2002-057217 | 2/2002 |

OTHER PUBLICATIONS

International Search Report mailed Jun. 22, 2004.
Japanese Office Action issued Nov. 11, 2008 for corresponding Japanese Application No. 2003-096093.

* cited by examiner

*Primary Examiner*—Lynne A Gurley
*Assistant Examiner*—Colleen A Matthews
(74) *Attorney, Agent, or Firm*—Rader, Fishman & Grauer PLLC

(57) ABSTRACT

By stably separating a melting location of a fuse (3) from conductive layers (5A, 5B), reliable melting of the fuse (3) is enabled. A fuse (3) including a fuse body (3A) and two pads (3Ba, 3Bb) connected by this and two conductive layers (5A, 5B) individually connected to the two pads (3Ba, 3Bb) are formed in a multilayer structure on a semiconductor substrate (1). A length of the fuse body (3A) is defined so that the melting location of the fuse (3) becomes positioned in the fuse body (3A) away from the region overlapped on the conductive layer (5A or 5B) when an electrical stress is applied between two conductive layers (5A, 5B) and the fuse (3) is melted.

18 Claims, 10 Drawing Sheets

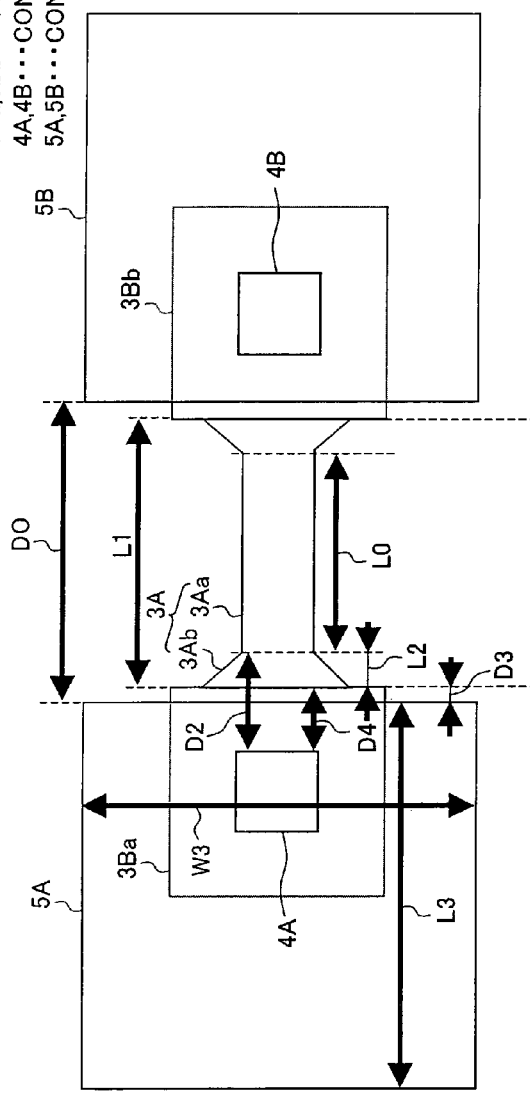
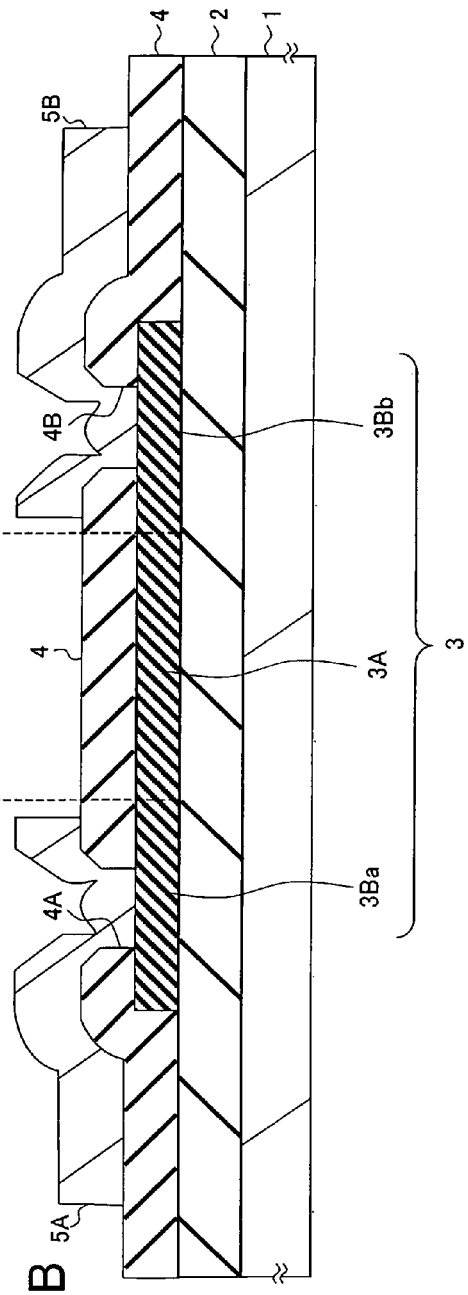
FIG. 1A
FIG. 1B

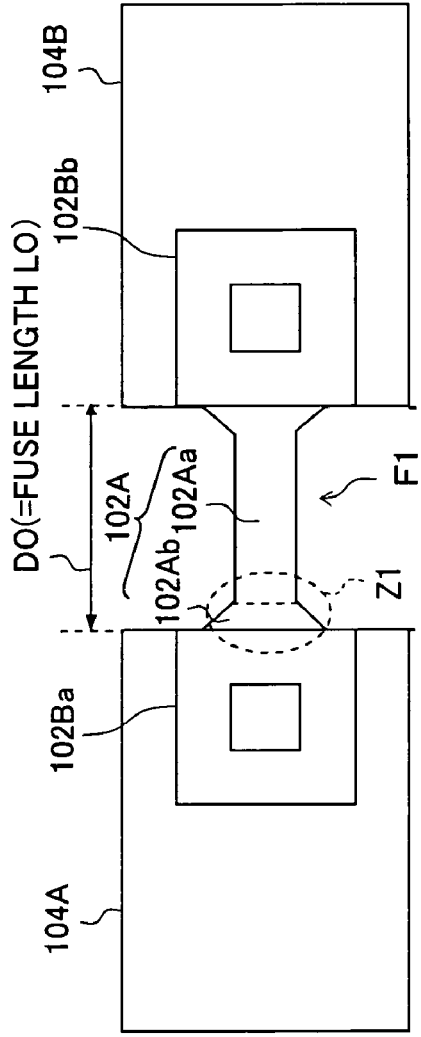
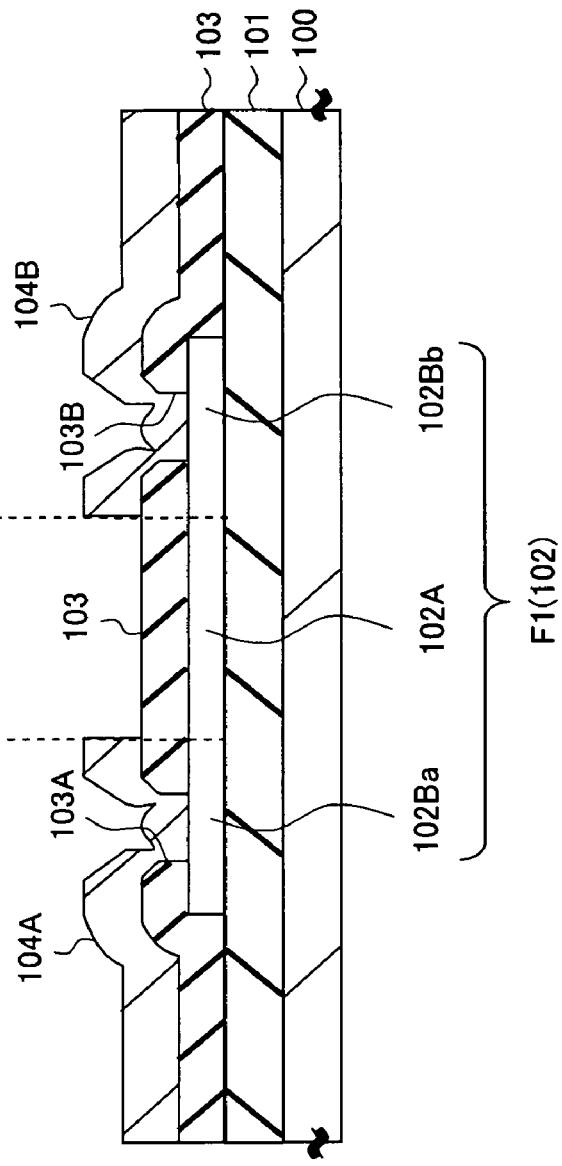
FIG. 10A
FIG. 10B

SEMICONDUCTOR DEVICE

TECHNICAL FIELD

The present invention relates to a semiconductor device having fuses made of a conductive material in a multilayer structure on a semiconductor substrate.

BACKGROUND ART

Conventionally, as technology for adjusting the characteristics of a semiconductor integrated circuit (IC) (trimming technology), there are for example, technologies using fuses made of polysilicon and technologies using Zener-zap diodes.

The trimming technology using fuses can form the fuses simultaneously with the formation of the polysilicon layer frequently used for gate electrodes or resistors of the transistors in the IC and can adjust the characteristics by the simple configuration by just inserting the fuses in current paths to be shut off, so the technology is widely used. The fuses are generally melt by irradiation of laser beams or by supplying current to the fuses.

FIG. 9 and FIG. 10 show a trimming circuit for melting a fuse by supplying a current taking as an example a case of adjusting the resistance value. FIG. 9 is a circuit diagram of the configuration of the trimming circuit.

The serial resistors R of the circuit shown in FIG. 9 are comprised of a reference resistor R0 (resistance value: r0) and trimming resistors R1 and R2 (resistance values: r1, r2). These resistors R0 to R2 are connected in series. Fuses F1 and F2 made of polysilicon are connected in parallel to the trimming resistors R1 and R2. An electrode pad PD1 is connected to a node between the reference resistor R0 and the trimming resistor R1, an electrode pad PD2 is connected to a node between the trimming resistors R1 and R2, and an electrode pad PD3 is connected to another side of the trimming resistor R2.

FIG. 10A and FIG. 10B are a plan view and a sectional view of the fuse F1. A semiconductor substrate 100 is formed with an insulating film 101. The insulating film 101 is formed with the fuse F1 comprised of polysilicon. A polysilicon layer 102 forming the fuse F1 is patterned to have a shape comprised of two pads 102Ba and 102Bb and a fuse body 102A connecting them. Further, the fuse body 102A is configured by a fuse line portion 102Aa and connection portion 102Ab formed so as to become broader further to the outside from the two ends of the fuse line 102Aa for the purpose of dispersing the electric field concentration at the corners.

The polysilicon layer 102 is formed with an inter-layer insulating film 103 comprised of, for example, silicon oxide or silicon nitride. The inter-layer insulating film 103 has an aperture (opening) at substantially the centers of the pads 102Ba and 102Bb at the two ends of the polysilicon layer 102. Pad openings (apertures) 103A and 103B are formed by this. Electrode layers 104A and 104B are formed with patterns larger than the pad openings 103A and 103B of the inter-layer insulating film 103 by one order of size. The electrode layers 104A and 104B are extended to the peripheral edge of the IC chip as electric wirings (interconnects) and connected to the electrode pads PD1 and PD2 shown in FIG. 9.

In the trimming circuit having such a configuration, for example, when checking the characteristics of the IC at the final stage of the wafer process, the fuse F1 or F2 is melted when required in order to make a predetermined characteristic approach the ideal value, in accordance with the results of measurement of the characteristics of the IC. Specifically, when the value of the resistor R may be r0 as it is, the fuse is not melted, but when the value of the resistor R is to be made larger than r0, the fuse F1 or F2 is melted. When melting the fuse F1, needles are attached to the electrode pads PD1 and PD2 and a predetermined current is supplied. As a result, the current density increases in the fuse body 102A of the polysilicon layer 102, the polysilicon layer 102 is melted at this portion, and the fuse F1 becomes cut-off. As a result, the value of the resistor R changes to (r0+r1). In the same way, when melting the fuse F2 by supplying current from the electrode pads PD2 and PD3, the value of the resistor R changes to (r0+r2). When melted both of the fuses F1 and F2, the value of the resistor R changes to (r0+r1+r2).

In such a conventional fuse, however, the melted location of the fuse varies, and the fuse is sometimes melted at a point Z1 shown in FIG. 10A. In this case, the electrode layer dissolves into the fuse due to heat generated and connects the melted locations of the polysilicon, and therefore it suffers from the disadvantage that the fuse is not sufficiently melted.

DISCLOSURE OF THE INVENTION

An object of the present invention is to provide a semiconductor device able to stably separate the melted location of a fuse from a conductive layer and thus able to reliably melt a fuse.

A first semiconductor device according to the present invention is a semiconductor device including a fuse (3) having a fuse body (3A) and two pads (3Ba, 3Bb) connected by the fuse body (3A) and two conductive layers (5A, 5B) individually connected to two pads (3Ba, 3Bb), the above being formed inside a multilayer structure on a semiconductor substrate (1), characterized in that a length (L1) of the fuse body (3A) is defined so that the melting location of the fuse (3) becomes positioned in the fuse body (3A) away from a region overlapped on the conductive layers (5A, 5B) when an electrical stress is applied between the two conductive layers (5A, 5B) to melt the fuse (3).

Preferably, the width of the fuse body (3A) is smaller than the width of each of the two pads (3Ba, 3Bb), and the length (L1) of the fuse body (3A) is 1.8 μm to 20 μm.

A second semiconductor device of the present invention is a semiconductor device including a fuse (3) having a fuse body (3A) and two pads (3Ba, 3Bb) connected by the fuse body (3A) and two conductive layers (5A, 5B) individually connected to two pads (3Ba, 3Bb), the above being formed inside a multilayer structure on a semiconductor substrate (1), characterized in that a width (W3) of portions of conductive layers (5A, 5B) including contact regions (4A, 4B) with the pads (3Ba, 3Bb) is defined in at least one of the above two conductive layers (5A, 5B) so that the melting location of the fuse (3) becomes positioned in the fuse body (3A) away from a region overlapped on the conductive layers (5A, 5B) when an electrical stress is applied between the two conductive layers (5A, 5B) to melt the fuse (3).

Preferably, the width (W3) of the portions of the conductive layers (5A, 5B) including the contact regions (4A, 4B) is 6 μm to 14 μm.

In the first or second semiconductor device, preferably at least one of the two conductive layers (5A, 5B) has a portion of a predetermined width (W3) connected to a corresponding pad (3Ba, 3Bb) and an interconnect (electric wiring) portion having a width narrower than the portion of the predetermined width (W3). Alternatively, preferably, the interconnect layer having a width narrower than that of the conductive layers (5A, 5B) is connected to at least one of the above two conductive layers (5A, 5B).

Also, a distance (D0) between the above two conductive layers (5A, 5B) is preferably larger than the distance (L1) between above two pads (3Ba, 3Bb) of the fuse (3).

Further, in at least one of the above two conductive layers (5A, 5B), a distance (D4) from the contact regions (4A, 4B) connecting the conductive layers (5A, 5B) and the pads (3Ba, 3Bb) to edges of the pad (3Ba, 3Bb) contacting the fuse body (3A) is preferably 0.25 μm to 0.90 μm.

According to the first or second semiconductor device, when the electrical stress is applied to the above two conductive layers (5A, 5B), a current flows from the conductive layer (5A and 5B) on a positive pole side to the fuse (3) via the contact region (4A or 4B). As a result, heat conduction and heat radiation (dissipation) due to Joule's heat occur in the fuse (3). Part of the heat mainly escapes to the two conductive layers (5A, 5B). And, movement of heat occurs due to the heat conduction effect in the fuse (3). For this reason, a peak point of heating is displaced (biased) from the center of the fuse (3) to the conductive layer (5A or 5B) side on the positive pole side.

In the first semiconductor device according to the present invention, the length (L1) of the fuse body (3A) is suitably defined, and therefore the heating peak point will not overly approach the conductive layer (5A or 5B) on the positive pole side. As a result, the fuse (3) is melted at a position nearer the center of the fuse body (3A) than the region of the fuse (3) overlapped on the conductive layers (5A, 5B), that is, a position away from the conductive layer end.

Further, in the second semiconductor device according to the present invention, the width of the conductive layer portion including the contact region with the pad is defined so that the melting position of the fuse (3) becomes nearer the center of the fuse body (3A) than the region of the fuse (3) overlapped on the conductive layers (5A, 5B). For this reason, the heat generation and the heat dissipation are balanced, and the fuse (3) is melted at a position away from the conductive layer end.

In this way, the length (L1) of the fuse body (3A) is suitably set so that the melting position of the fuse (3) does not become too close to the conductive layers (5A, 5B), therefore short-circuits between the conductive layers (5A, 5B) and the fuse (3) do not easily occur at the edge portions of the conductive layers (5A, 5B). As a result, the resistance at the time of cutting off the fuse can be sufficiently and stably raised, and a fuse defect rate can be reduced.

As a result, with this semiconductor device, it becomes possible to almost completely ignore fuse defects and the work and cost for checking fuses (3) can be eliminated.

Further, when the device has a selection circuit (10) of fuses (3), it becomes possible to detect the necessity/unnecessity of adjusting the characteristics by the fuses (3) at the time of product shipment of the semiconductor device and provide low defect rate, easy to use semiconductor products.

BRIEF DESCRIPTION OF THE DRAWINGS

FIG. 1A is a plan view of a fuse according to an embodiment of the present invention.

FIG. 1B is a sectional view thereof.

FIG. 10A is a plan view of the configuration of a fuse of the trimming circuit.

FIG. 10B is a sectional view thereof.

BEST MODE FOR WORKING THE INVENTION

First Embodiment

Figure 2:
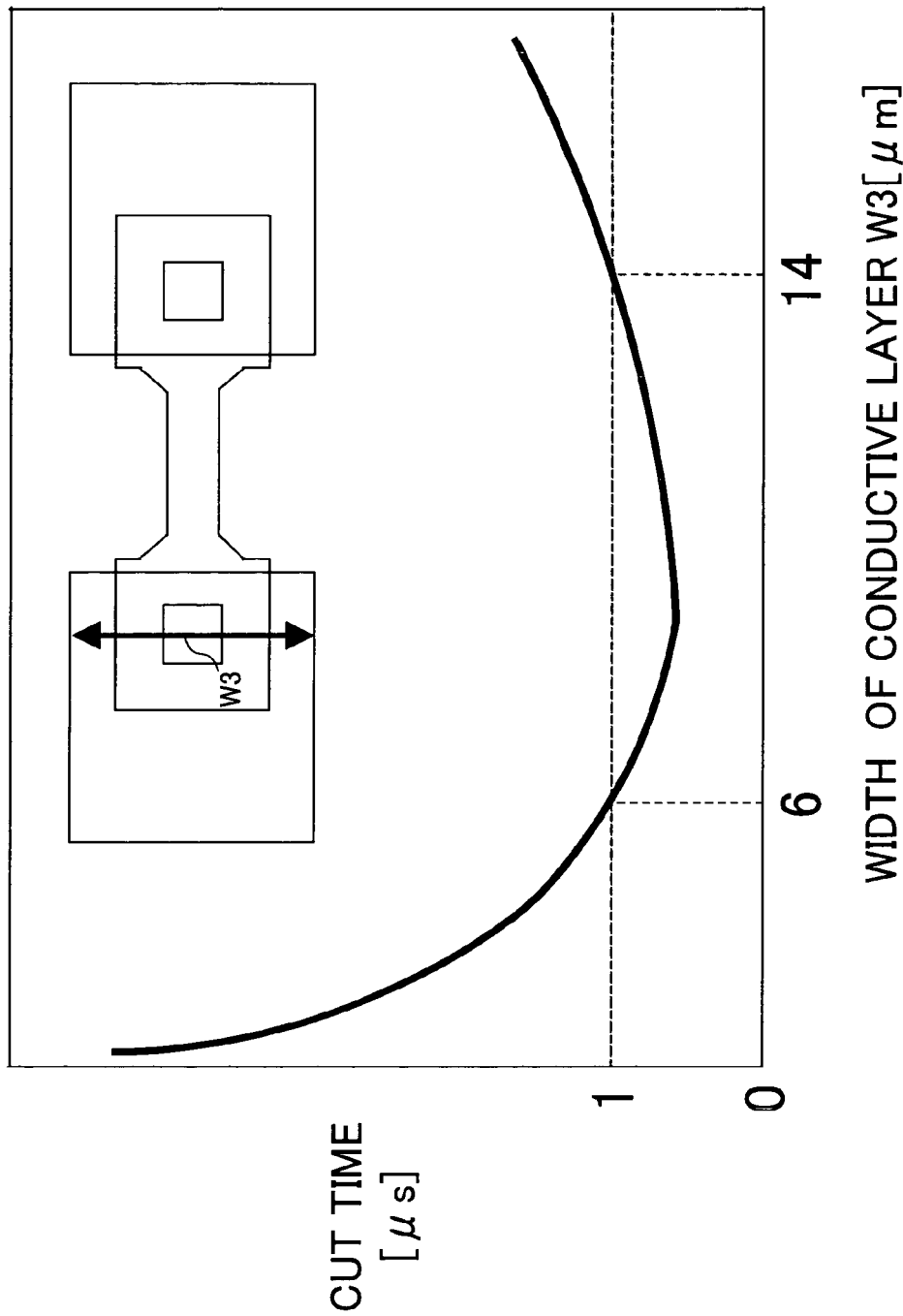
FIG. 2 is a graph showing a cut time dependency of conductive layer width.

FIG. 1A and FIG. 1B are a plan view and a sectional view of a fuse according to an embodiment of the present invention.

A semiconductor substrate 1 is formed with an insulating film 2. The insulating film 2 is formed with a fuse 3 comprised of a conductive material such as polysilicon. The fuse 3 is comprised of two pads 3Ba and 3Bb and a fuse body 3A connecting them. The fuse body 3A is comprised of a fuse line 3Aa and connections 3Ab formed so as to become broader toward the outside at the two ends of the fuse line 3Aa for the purpose of dispersing the concentration of the electric field at the corners. These fuse line 3Aa, two connections 3Ab, and two pads 3Ba and 3Bb are for example formed all together by patterning a conductive film comprised of a polysilicon film doped with P-type or N-type impurities.

The fuse 3 is formed over it with an inter-layer insulating film 4 made of for example silicon oxide or silicon nitride. The inter-layer insulating film 4 is opened to have an aperture at the substantial centers of the pads 3Ba and 3Bb at the two ends of the fuse 3. Openings (apertures) 4A and 4B are formed by this. The conductive layers 5A and 5B are formed by patterns larger than the openings 4A and 4B of the inter-layer insulating film 4 by one size. Note that the openings 4A and 4B constitute an embodiment of the "contact region" of the present invention.

Here, in a fuse having such a configuration, the length L and the width W of each portion and the distance D between the portions are defined as shown in FIG. 1A. The length L is a dimension in the direction of the current flowing through the fuse, and the width W means the dimension in a direction perpendicular to the current direction.

The length of the fuse line 3Aa is defined as L0, the length of the fuse body 3A is defined as L1, the length of the connection 3Ab is defined as L2, and the length of the two conductive layers 5A and 5b is defined as L3. Further, the width of the portion including the contact region 4A or 4B of the conductive layer 5A or 5B is defined as W3. Further, the dimension between the conductive layers 5A and 5B is defined as D0, the distance between the fuse line 3Aa and the contact region 4A and the distance between the other contact region 4B and the fuse line 3Aa are defined as D2, the distance between the fuse body 3A and the conductive layer 5A or 5B is defined as D3, and the distance from the contact region 4A to the fuse side end of the pad 3Ba and the distance from the contact region 4B to the fuse side end of the pad 3Bb are defined as D4.

Note that it is not always necessary to form the fuse 3 horizontally symmetrically as shown in FIG. 1A. In the case of asymmetry, the definitions of the length L, the width W, and the distance D described above are applied to the side which becomes the positive pole at least at the time of applying a bias voltage (biasing). Below, it is assumed that the conductive layer 5A is the positive pole side.

Further, the distance D3 between the fuse body and the conductive layer may be 0 as well. Note that preferably the distance D3 has a positive value in the point that a fuse body having a higher resistance value than the pad and blowing can be separated from the conductive layer 5A. Conversely, when the distance D3 is too large, the distance D2 becomes larger, the distance from the fuse body 3A to the current supply point (contact region 4A) is too large, and a resistance component not contributing to the heating very much increases, therefore there is a suitable range in such point.

Further, the connections 3Ab have shapes larger toward the pad sides, but they may be of any shape. Further, the connections 3Ab may or may not be provided.

In the present embodiment, under certain bias conditions, the melting position of the fuse changes according to the three-dimensional shape of the fuse 3, that is, the film thickness and planar pattern and the material of the fuse 3, the three-dimensional shape of the conductive layer 5A on at least the positive pole side, that is, the film thickness and planar pattern and the material of the conductive layer, and further various structural parameters defined in the above description.

By various studies, it was learned that the parameters greatly influencing the melting position of a fuse among the various structural parameters are the length L1 of the fuse body, the width W3 of the portion of the conductive layer including the contact region 4A, the distance D2 between the fuse line 3Aa and the contact region 4A, and the distance D4 from the contact region 4A to the pad end. In comparison with the width of the fuse line 3Aa, the length L0 thereof or the length L1 of the fuse body 3A exerts a large influence upon the position of the melting part. Further, the length L3 of the conductive layer 5A exerts an influence upon the heat dissipation ability, but the width W3 of the contact region 4A of the conductive layer 5A exerts a larger influence upon the position of the melting part.

Based on these discoveries, below the inventors will describe the results of checking the dependency on the time for melting a fuse (hereinafter referred to as a "cut time") for each of the three structural parameters L1, W3, and D4. Note that it is seen that the distance D2 between the fuse line and the contact region is within the group of parameters having a large influence in the structure of FIG. 1A, but the connections 3Ab are optional in the present embodiment, and therefore no study is carried out here on these.

The inventors changed different ones of the three structural parameters L1, W3, and D4, but used typical values for the remaining parameters. In explaining the typical other structural parameters, the length L1 of the fuse body and the distance D0 between the conductive layers are 2.5 to 6.0 μm, the length L3 and the width W3 of the conductive layer is 6 to 10 μm, the width of the fuse line 3Aa is several tenths of a micron, and the distances D2, D3, and D4 are 0.5 to 1.5 μm, 0.01 to 0.3 μm, and several tenths of a micron. Further, the thickness of the insulating film 2 was several hundred nm, the film thickness of polysilicon was several tens to 250 nm, and the thickness of the silicon oxide film 4 was 200 to 500 nm.

The conductive layer is successively comprised of Ti/TiON/Ti/Al/TiON from the bottom layer. At this time, the fuse had an initial resistance value of 500 to 800Ω, and a sheet resistance of several tens to 150Ω/□.

FIG. 2 shows a cut time dependency of the conductive layer width W3. When the conductive layer width W3 is too small or too large, the cut time becomes longer. Further, when the cut time is 1 μm or less, the optimal range of the conductive layer width W3 is 6 μm to 14 μm. Here, the cut time of 1 μs is used as the standard because it is found by experience from variation data changing various structural parameters that the occurrence of a fuse not satisfying the resistance standard 20 MΩ or more deemed as melting starts when the time taken for melting exceeds 1 μs. Especially, as shown in FIG. 2, when the conductive layer width W3 is made smaller than 6 μm, the cut time for melting the fuse and making the resistance value within the standard of 20 MΩ or more abruptly becomes longer.

A fuse where the resistance value deviates from the standard by melting it by applying a bias voltage for a longer time than 1 μs was analyzed by an SEM. A schematic sectional view drawn based on an SEM photograph of the cross section of the device is shown in FIG. 5.

Figure 5:
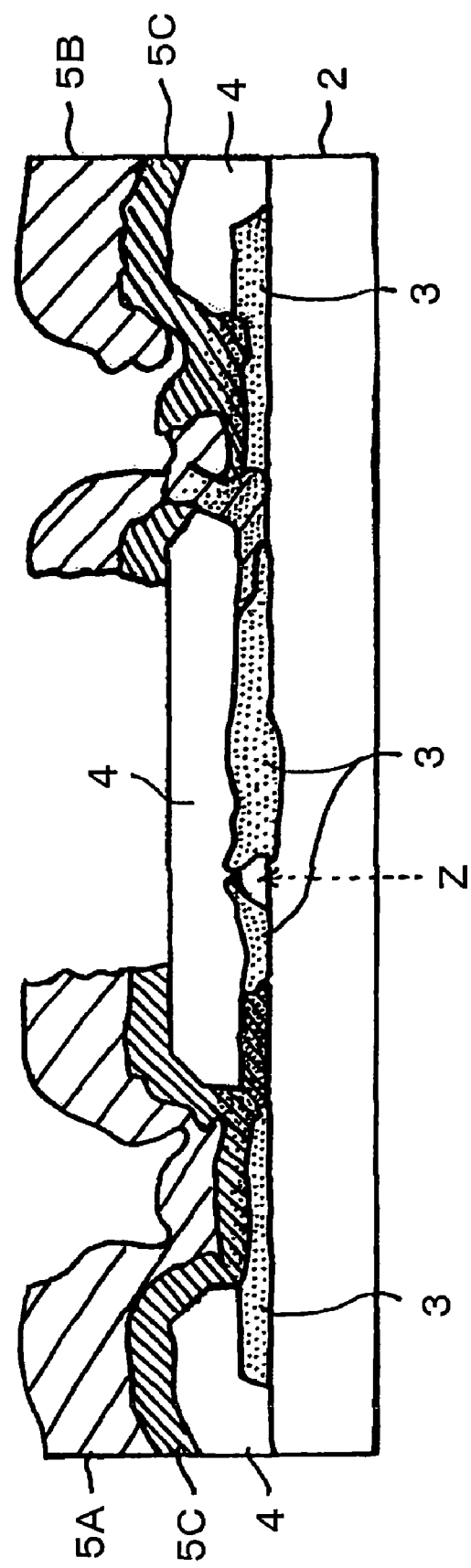
FIG. 5 is a schematic sectional view, drawn based on an SEM photograph, of a fuse with a resistance value deviating from the standard by being melted by applying a bias voltage for a long time.

From FIG. 5, the broken location Z of the polysilicon film 3 is located on the conductive layer (A1 electrode) 5A side to which a positive voltage is applied. On this positive pole side, the Ti/TION/Ti layer 5C are melted out and forms an alloy layer with the polysilicon. Further, aluminum (Al) is melted out on the conductive layer 5B side to which the ground potential is imparted, whereby an alloy layer of this and polysilicon is formed. These alloy layers are layers having a lower resistance than the polysilicon. The resistance value of the fuse no longer satisfies the resistance standard 20 MΩ or more due to the existence of such an alloy layer.

Figure 3:
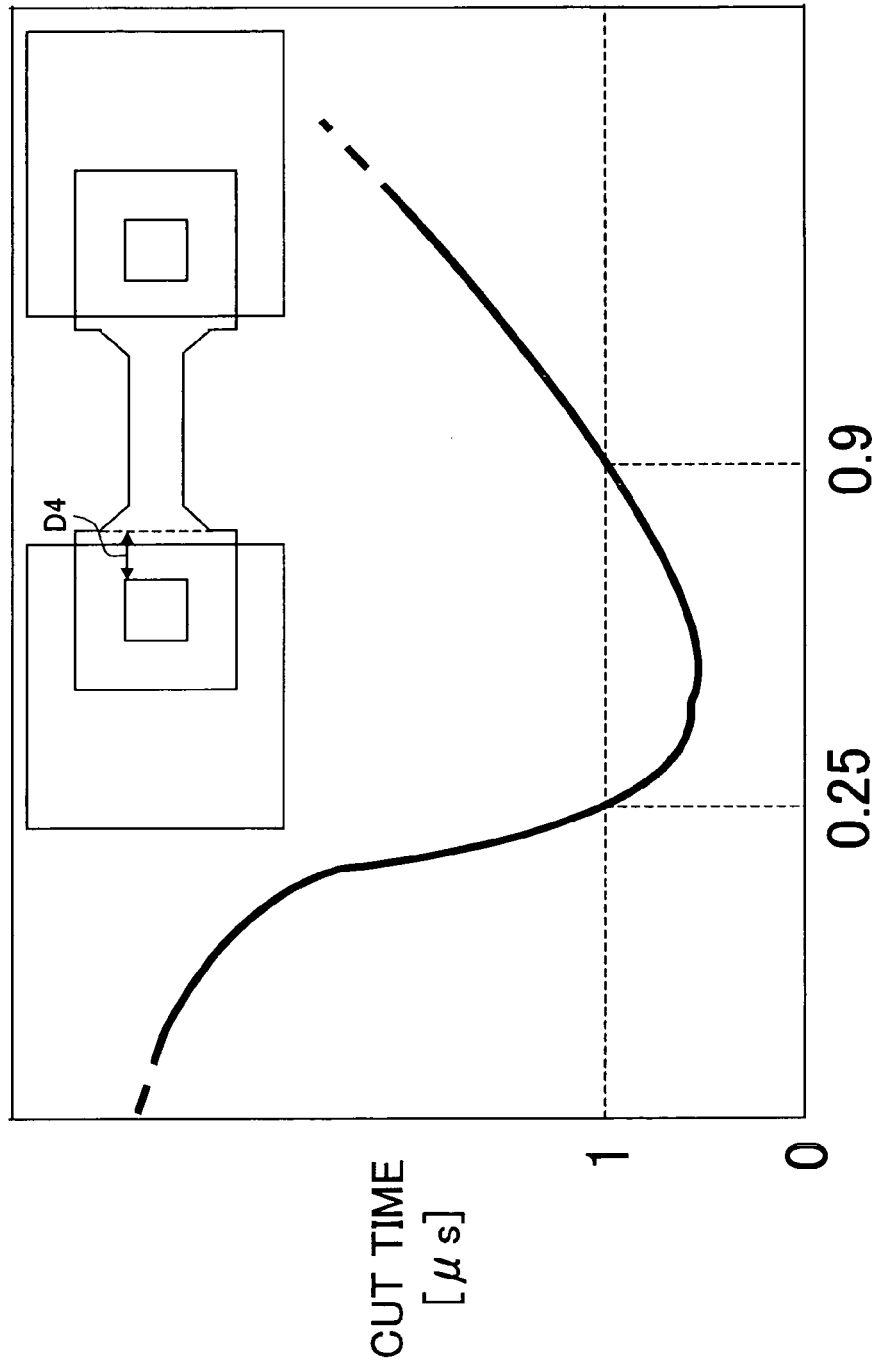
FIG. 3 is a graph showing a cut time dependency of a distance between a pad edge and a contact region.

FIG. 3 shows the cut time dependency of the distance D4 between the pad edge and the contact region.

This distance D4 also exhibits a cut time dependency having the same tendency as that of the conductive layer width W3 shown in FIG. 2. The cut time becomes longer when the distance D4 is too small or too large. Further, when the cut time is 1 μs or less, there is an optimal range of the distance D4 of 0.25 μm to 0.9 μm. Here, the cut time of 1 μs is used as the standard of the optimal range in the same way as the above. Especially, as shown in FIG. 3, when the distance D4 is made smaller than 0.25 μm, the cut time for making the resistance value within the standard of 20 MΩ or more by melting the fuse abruptly becomes longer. This is because, in the same way as FIG. 5 mentioned before, when the bias application time is made long, an alloy layer of a Ti/TiON/Ti layer and polysilicon or an alloy layer of aluminum (Al) and polysilicon is formed, and the fuse resistance value after cutting becomes large to only a certain extent.

Figure 4:
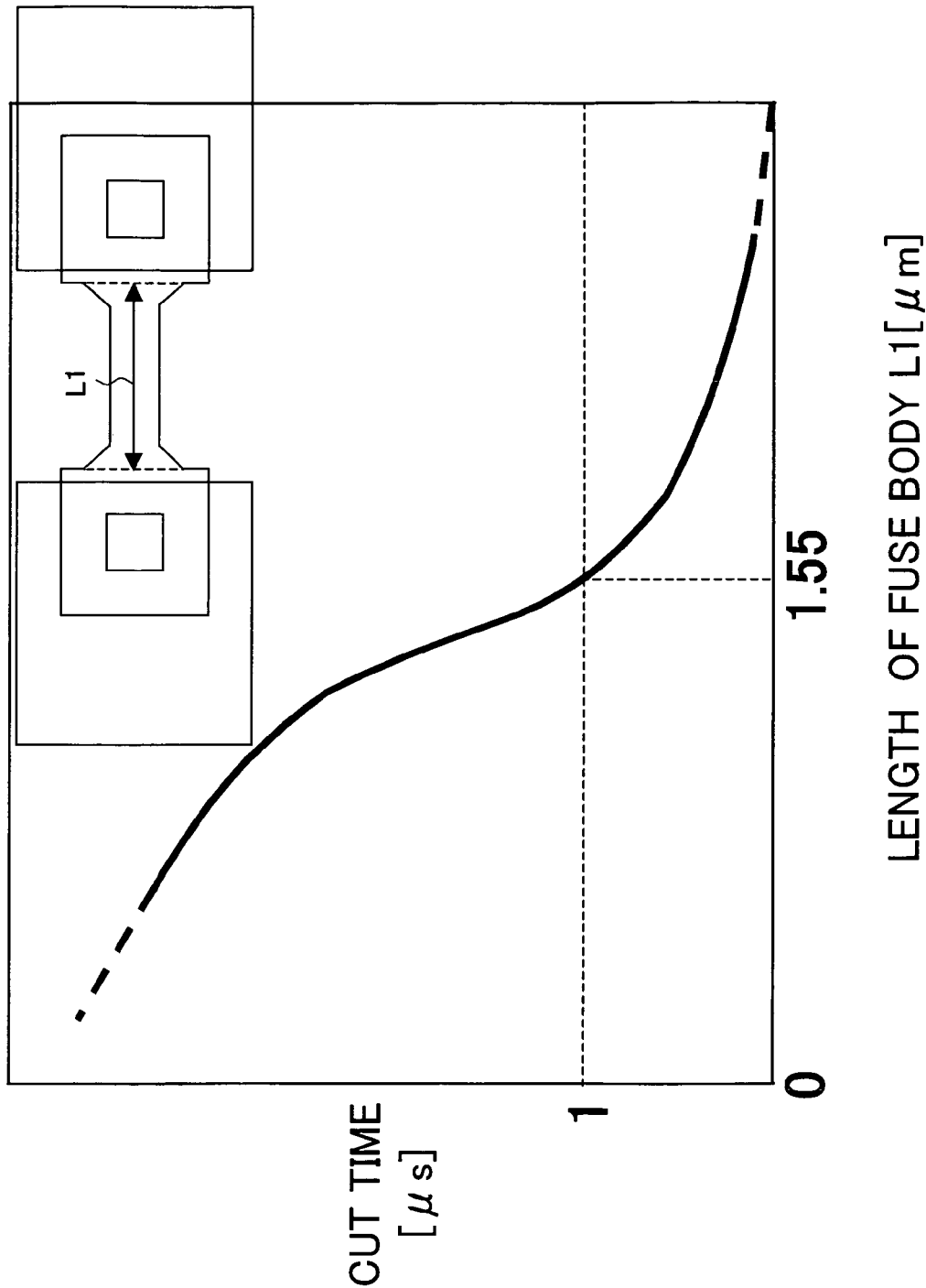
FIG. 4 is a graph showing a cut time dependency of fuse body length.

FIG. 4 shows the cut time dependency of the length L1 of the fuse body.

The fuse body length L1 differs in the tendency of the cut time dependency from the conductive layer width W3 and the distance D4. When the length L1 is made smaller, the cut time abruptly becomes long when the length L1 is approximately 1.55 μm. However, when the length L1 is made longer, the cut time becomes longer and longer and becomes saturated when the length L1 reaches a certain length. Almost no change of the cut time is seen from that point of time. Further, it was also clarified that when the length L1 of the fuse body was made long, there was a limit after which the fuse was not cut under any bias conditions. When experimentally confirming this limit point by samples having a variety of structural parameters, it was found to be when the length L1 of the fuse body was about 20 µm. Accordingly, in the same way as the case of the previous two examples, when the cut time of 1 µs is or less is applied, the range of the length L1 of the fuse body can be defined as "1.55 µm to 20 µm".

Note that it is necessary to restrict the fuse body length L1 from another viewpoint of "oblique breakage". "Oblique breakage" means the phenomenon that an alloy layer of a Ti/TiON/Ti layer and polysilicon or an alloy layer of aluminum (Al) and polysilicon is not formed in the contact region 4A or 4B, but the inter-layer insulating film 4 is broken immediately under the edge of the conductive layer 5A on the positive pole side and the alloying of the polysilicon occurs at this location.

Figure 6:
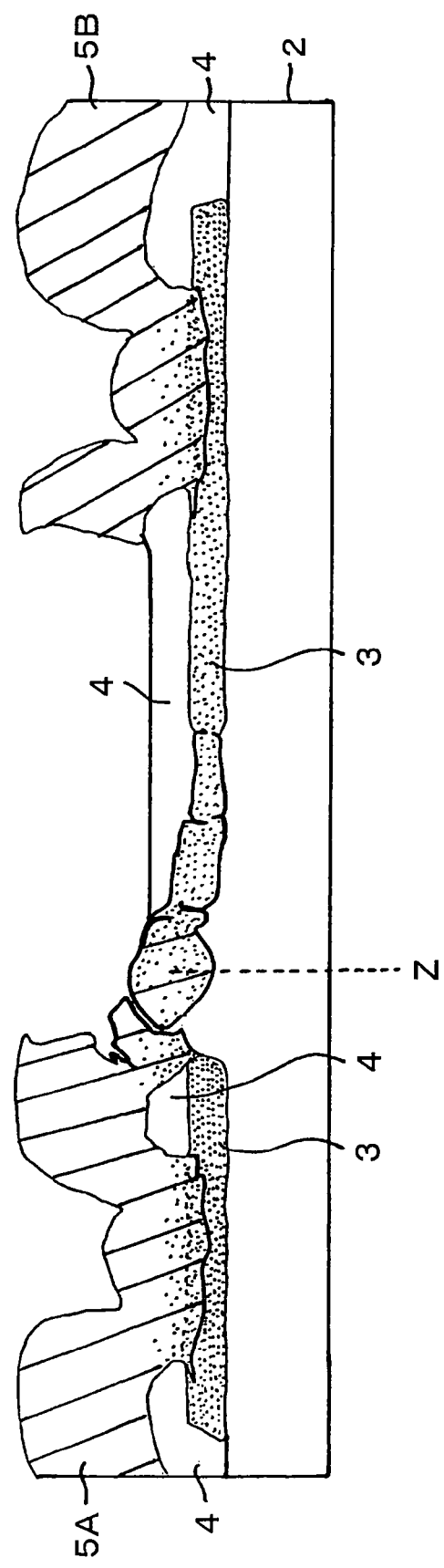
FIG. 6 is a schematic sectional view, drawn based on an SEM photograph, of oblique breakage of a fuse.

FIG. 6 shows a schematic sectional view, drawn based on an SEM photograph, of a fuse with oblique breakage. When oblique breakage occurs, the fuse short-circuits, so the resistance value is abruptly lowered. As a result, the fuse resistance value becomes much lower than the resistance standard value of "20 MΩ or more" regarded as melting.

In order to optimize the range "1.55 µm to 20 µm" of the length L1 of the fuse body described above, in order to reduce the defect rate of fuse melting, the lower limit value side thereof must meet the condition that oblique breakage will not occur. Namely, when the melting location of the fuse is over the edge of the conductive layer 5A even a little, the probability of oblique breakage abruptly increases, so the range of the length L1 of the fuse body must be restricted so as not to allow this.

Figure 7:
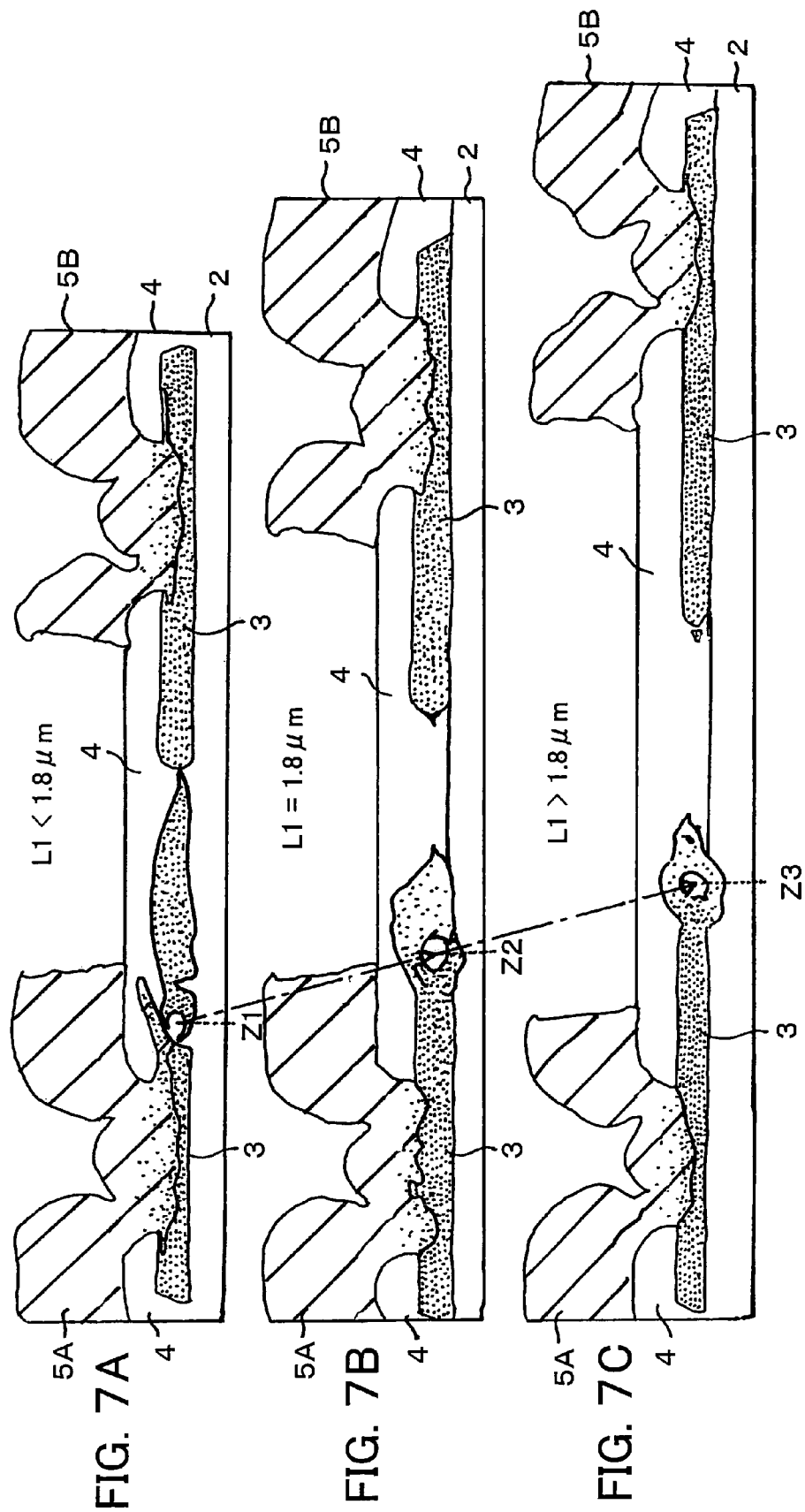
FIG. 7A to FIG. 7C are schematic sectional views, drawn based on SEM photographs, of fuses after being melted when changing a fuse body length L1 centered around 1.8 μm.

FIG. 7A to FIG. 7C show schematic cross-sections, drawn based on SEM photographs, of fuses after being melted when the fuse body length L1 is changed centered around 1.8 µm.

When the length L1 is smaller than 1.8 µm, as shown in FIG. 7A, the center Z1 of the breakage location of the fuse is located beneath the conductive layer 5A. At this time, the probability of oblique breakage is considerably high. In FIG. 7B in which the center Z2 of the breakage location of the fuse substantially coincides with the edge of the conductive layer 5A, the length L1 of the fuse body is 1.8 µm. Also, at this time, the probability of oblique breakage is high, but when the length L1 becomes larger than this even when the amount of change is small, the probability of oblique breakage is lowered. Then, as shown in FIG. 7C, when the length L1 of the fuse body becomes sufficiently larger than 1.8 µm, the center Z3 of the breakage location is far away from the edge of the conductive layer 5A, and therefore the possibility of oblique breakage becomes substantially zero. In the case of FIG. 7A, the separated portions of the fuse almost contact each other, and therefore the cut time becomes considerably long. In the case of FIG. 7B, the separated portions of the fuse are considerably apart, and therefore the cut time is abruptly lowered and sometimes enters the standard (1 µs or less). Note that there is a possibility of oblique breakage, therefore, according to the case, the possibility remains that the cut time will deviate from the standard. When the fuse body length L1 becomes longer than that in the case of FIG. 7B, even a little, the possibility of oblique breakage is lowered, and therefore the cut time enters the standard range. As shown in FIG. 7C, when the separation of the fuse becomes sufficient, even when the separation distance becomes far more than that, the resistance value does not change much, so the cut time is stabilized on the low side.

In this way, the value of the fuse body length L1 of 1.8 µm can be said to be the lower limit border of a realistic range. Accordingly, the suitable range of the fuse body length L1 becomes "1.55 µm to 20 µm" and further preferably "larger than 1.8 µm to 20 µm".

According to the present embodiment, by using one of the three structural parameters L1, W3, and D4 mentioned above or a combination of any plurality of these parameters, the possibility of the resistance value after the fuse is melted deviating from the standard can be greatly reduced.

Conventionally, the rate of occurrence of the defectively melted fuses was relatively high; therefore, chips with such defects were sometimes sent on to the package assembly process still without trimming the characteristics by the fuses. In that case, the defect rate of characteristics in the shipment inspection after assembly sometimes became high and therefore there was a lot of waste in materials, costs, etc. Alternatively, it is also possible not to send the chips with defectively melted fuses on to the assembly process as a PC (pellet check) defects, but defectively melted fuses do not have a direct relation with the quality of the characteristics trimmed. Accordingly, if doing this, chips which are originally good products are rejected as defective products in the wafer process stage, so waste of materials and costs sometimes occurs in this case as well.

In the present embodiment, it is possible to greatly reduce the fuse defect rate by optimization of the structural parameters L1, W3, and D4, therefore, for example, even when trimming the characteristics after assembling the elements into a package or assembling a bare chip into a module, the waste of costs becomes small.

Note that the conductive layers 5A and 5B having the width W3 may be used as usual interconnects without defining the length. L3 thereof, but the width W3 frequently becomes larger than the usual interconnect width. In this case, at least the conductive layer on the positive pole side, for example, only the conductive layer 5A, or both of conductive layers 5A and 5B can be defined as the front end portion having a broad width of the interconnect layer. In this case, the interconnect layer and the conductive layer 5A or 5B are formed all together by patterning one conductive film. Alternatively, the interconnect layer and the conductive layers 5A and 5B can be formed from different levels of the multi-layer structure of the semiconductor substrate. For example, the conductive layers 5A and 5B can be formed from a first Al layer (first layer), and the interconnect layer can be formed from a second Al layer (second layer) connected to this via a no-illustrated contact plug.

Second Embodiment

The present embodiment relates to a semiconductor device provided with a fuse selection circuit. It is possible not to optimize any of the structural parameters L1, W3 and D4 in the fuses, but preferably fuses having the structure explained in the first embodiment are used. When using such fuses, the defect rate of the characteristics at the time of the shipment inspection can be improved as previously mentioned, but the present embodiment is characterized in that a means for electrically selecting the fuses is further provided in order to improve the defect rate of the characteristics by trimming the characteristics at the time of shipment inspection.

Figure 8:
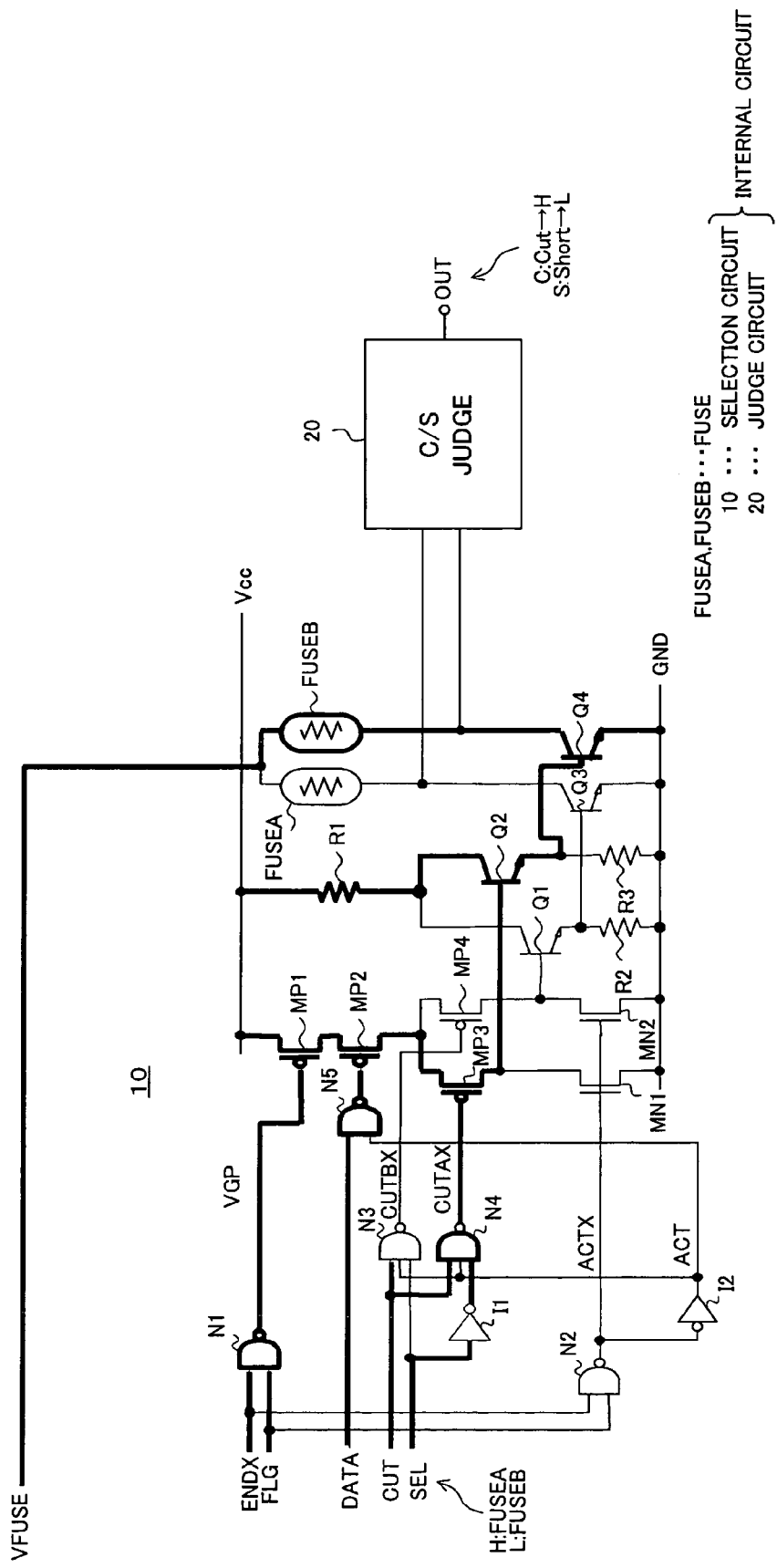
FIG. 8 is a circuit diagram of the configuration of a drive voltage control circuit including a fuse selection circuit according to a second embodiment of the present invention.
Figure 9:
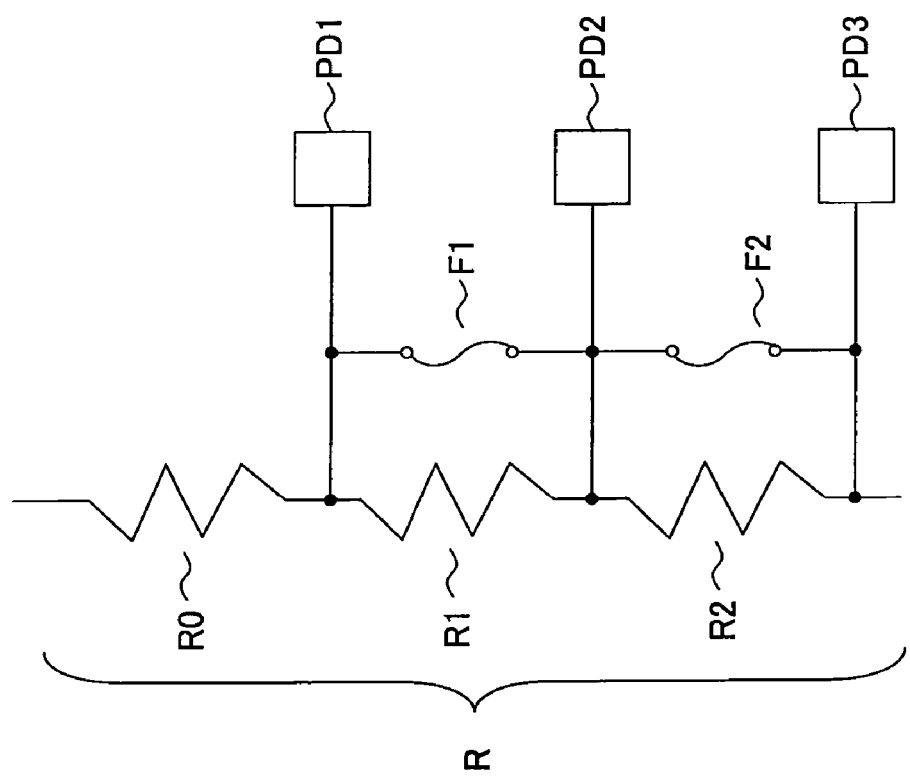
FIG. 9 is a diagram of a trimming circuit for melting a fuse by supplying a current.

FIG. 8 is a circuit diagram of the configuration of a drive voltage control circuit mounted on an LCD (Liquid Crystal Display) drive IC etc.

This characteristic adjustment circuit (drive voltage adjustment circuit) has a double poly-fuse configuration. The fuses FUSEA and FUSEB are connected in parallel to the supply line of a drive voltage VFUSE. The circuit 10 selecting the fuses has five NAND gates N1 to N5, two inverters I1 and I2, four PMOS transistors MP1 to MP4, two NMOS transistors MN1 and MN2, three resistors R1 to R3, and four bipolar transistors Q1 to Q4. The transistors MP1, MP2, MP3, and MN1 are connected between a power supply voltage $V_{cc}$ and a ground potential node GND. In the same way, the transistors MP1, MP2, MP4, and MN2; the resistor R1, the transistor Q1, and the resistor R2; and the resistor R1, the transistor Q2, and the resistor R3 are connected between the power supply voltage $V_{cc}$ and the ground potential node GND.

An output VGP of the NAND gate N1 is input to the gate of the transistor MP1, and control signals ENDX and FLG are input to two inputs of the NAND gate N1. The control signals ENDX and FLG are input to also the NAND gate N2, and an output ACTX thereof is input to gates of the transistors MN1 and MN2 and an inversion input of the inverter I2. The output ACT of the inverter is input to the NAND gates N3, N4, and N5. Signals CUT are input to the NAND gates N3 and N4, and selection signals SEL of the fuses are input to the NAND gate N3 and the inverter I1. The output of the inverter I1 is input to the NAND gate N4, and an output CUTAX thereof is input to the gate of the transistor MP3. On the other hand, an output CUTBX of the NAND gate N3 is output to the gate of the transistor MP2, and a data signal DATA is input to the input of the NAND gate N5.

The potential of the node of the transistors MP3 and MN1 is applied to the base of the transistor Q2. The transistor Q2 turns ON or OFF by that. When an emitter potential of the transistor Q2 changes, the transistor Q4 having a high withstand voltage turns ON or OFF by that. Due to this, the current of the fuse FUSEB turns ON or OFF. In the same way, the potential of the node of the transistors MP4 and MN2 is applied to the base of the transistor Q1, and the transistor Q1 turns ON or OFF by that. When the emitter potential of the transistor Q1 changes, the transistor Q3 having a high withstand voltage turns. ON or OFF by that. By this, the current of the fuse FUSEA becomes ON or OFF.

Next, details of this circuit operation will be explained in further detail by taking as an example a case where the fuse FUSEB is selected. A line which becomes active at the time of this operation is indicated by the bold line in FIG. 8.

In the fuse defect detection mode, both of the control signals ENDX and FLG are "H", therefore the output VGP of the NAND gate N1 becomes "L", and the state where the transistor MP1 can be made ON is exhibited. Further, the output ACTX of the NAND gate N2 becomes "L", and the inverted signal ACT thereof becomes "H". In this case, this signal ACT is "H", and therefore the state where the NAND gate N5 can control the transistor MP2 in accordance with the data signal DATA is exhibited. That is, when the data signal DATA is "L", the transistor MP2 cannot become ON, and therefore no fuse is cut, but when the data signal DATA is "H", a fuse cut instruction is issued, and a state where the transistor MP2 can be made ON under the control of the NAND gate N5 is exhibited.

In this state, when a permission signal CUT of the fuse cut becomes "H" and the fuse selection signal becomes "L", the output CUTBX of the NAND gate N3 becomes "H", and the output CUTAX of the NAND gate N4 becomes "L". As a result, the transistor MP3 becomes the ON enable state, and the MP4 becomes the OFF state. The NMOS transistors MN1 and MN2 are OFF, and therefore the potential of "H" is applied to the base of the transistor Q2. This "H" potential is transmitted to the base of the transistor Q4. As a result, a current of for example about several tens mA flows through the fuse FUSES, and the fuse FUSES is cut.

On the other hand, the selection signal SEL is "L", therefore, the output CUTBX of the NAND gate becomes "H", and the control transistors MP4, Q1, and Q3 of the fuse FUSEA side remain OFF as they are. As a result, no current flows through the fuse FUSEA.

The potential of the node of the fuse FUSEA and the transistor Q3 reflects the resistance value of the fuse FUSEA. In the same way, the potential of the node of the fuse FUSES and the transistor Q4 reflects the resistance value of the fuse FUSES. A C/S judgment circuit 20 judges whether or not the fuse resistance value satisfies the standard based on these two outputs. When the fuse resistance value is sufficiently high, "H" indicating the cut state is output as the output signal OUT, while when the resistance value does not become sufficiently high in the initial state and by fuse defects, "L" indicating the short-circuited state is output as the output signal OUT.

In this double poly-fuse configuration, even when the disadvantage occurs in melting one fuse, the characteristic can be adjusted unless the other fuse is defective. The probability of both fuses being defective is extremely low, therefore there is almost no case where the characteristic cannot be adjusted at the time of the shipment inspection.

Note that when using the fuses of the first embodiment with the improved defect rate, the reliability sufficiently rises even with a single fuse configuration. In that case, one group of control transistors and the control circuit of the select signal can be omitted.

In the present embodiment, by combining a large number of such fuse selection circuits, fine adjustment of the liquid crystal display (LCD) drive voltage of, for example, an LCD driver IC can be easily carried out.

In an LCD panel, the number of ICs for driving one panel increases since a higher resolution is achieved. For this reason, it becomes important to effectively prevent vertical stripes from being seen on a screen due to the difference in characteristics between driver ICs. For this reason, ICs having the function of electrically adjusting the drive output voltage in accordance with internal data are desired.

This fuse selection circuit 10 and the C/S judgment circuit 20 automatically detect the necessity for adjustment of the characteristics by the fuses according to the internal data DAT and can electrically detect the existence of fuse defects. For this reason, the big advantage is obtained that, particularly, even in a case of an IC after package assembly or a case where there is no mounting space like a panel drive circuit of a portable device and the IC chip is assembled on the substrate bare, the necessity of adjustment of the characteristics by the fuses and fuse defects can be electrically detected from the outside. Note that, even when this function is provided, detection of fuse defects at the stage of the wafer or chip by the present configuration is not excluded.

The invention claimed is:

1. A semiconductor device comprising a fuse (3) having a fuse body (3A) and two pads (3Ba, 3Bb) connected by the fuse body (3A) and two conductive layers (5A, 5B) individually connected to two pads (3Ba, 3Bb), the above being formed inside a multilayer structure on a semiconductor substrate (1), characterized in that a length (L1) of the fuse body (3A) is defined so that the melting location of the fuse (3) becomes positioned in the fuse body (3A) away from a region overlapped on the conductive layers (5A, 5B) when an electrical stress is applied between the two conductive layers (5A, 5B) to melt the fuse (3); and in at least one of the above two conductive layers (5A, 5B), a distance (D4) from the contact regions (4A, 4B) connecting the conductive layers (5A, 5B) and the pads (3Ba, 3Bb) to edges of the pad (3Ba, 3Bb) contacting the fuse body (3A) is 0.25 μm to 0.90 μm.

2. A semiconductor device comprising a fuse (3) including a conductive material in a multilayer structure on a semiconductor substrate (1), said fuse (3) having a fuse body (3A) and two pads (3Ba, 3Bb) connected by the fuse body (3A), conductive layers (5A, 5B) connected one by one to said two pads (3Ba, 3Bb),
characterized in that, in at least one of the above two conductive layers (5A, 5B), a width (W3) of the portions of the conductive layers (5A, 5B) including the contact regions (4A, 4B) with the pads (3Ba, 3Bb) is 6 µm to 14 µm.

3. A semiconductor device comprising:
a fuse body (3A) connected to a pad (3Ba), said fuse body (3A) including a fuse line (3Aa) and two connections (3Ab);
an inter-layer insulating film (4) on said pad (3Ba), an opening (4A) through said inter-layer insulating film (4) exposing said pad (3Ba);
a conductive layer (5A) on said inter-layer insulating film (4), said conductive layer (5A) within said opening (4A) being electrically connected to said pad (3Ba),
wherein at least one of the following is present:
(a) the width (W3) of said conductive layer (5A) is 6 µm to 14 µm,
(b) the distance (D4) between said fuse line (3Aa) and said opening (4A) is 0.25 µm to 0.90 µm,
(c) the length (L1) of the fuse body (3A) is 1.8 µm to 20 µm.

4. A semiconductor device as set forth in claim 3, wherein the melting location of a fuse (3) becomes positioned in said fuse body (3A) away from a region overlapped on said conductive layer (5A) when an electrical stress to melt said fuse (3) is applied between said conductive layer (5A) and another conductive layer (5B).

5. A semiconductor device as set forth in claim 3, wherein said width (W3) of said conductive layer (5A) is 6 µm to 14 µm.

6. A semiconductor device as set forth in claim 3, wherein said distance (D4) between said fuse line (3Aa) and said opening (4A) is 0.25 µm to 0.90 µm.

7. A semiconductor device as set forth in claim 3, wherein said length (L1) of the fuse body (3A) is 1.8 µm to 20 µm.

8. A semiconductor device as set forth in claim 3, wherein said width (W3) is a dimension perpendicular to the direction of current flowing through a fuse (3).

9. A semiconductor device as set forth in claim 3, wherein said length (L1) is a dimension in the direction of current flowing through a fuse (3), said length (L1) including the length (L0) of said fuse line (3Aa) and the lengths (L2) of said two connections (3Ab).

10. A semiconductor device as set forth in claim 3, wherein another conductive layer (5B) within another opening (4A) through said inter-layer insulating film (4) is electrically connected to another pad (3Bb), the distance (D0) between said conductive layer (5A) and said another conductive layer (5B) is larger than said length (L1).

11. A semiconductor device as set forth in claim 3, wherein one of the connections (3Ab) electrically connects said pad (3Ba) with fuse line (3Aa), said one of the connections (3Ab) being between said pad (3Ba) and said fuse line (3Aa).

12. A semiconductor device as set forth in claim 3, wherein each of said two connections (3Ab) is wider than said fuse line (3Aa).

13. A semiconductor device as set forth in claim 3, wherein a connection (3Ab) of said two connections (3Ab) has a width that increases toward said pad (3Ba).

14. A semiconductor device as set forth in claim 3, wherein the width of the fuse body (3A) is smaller than the width (W3) of said pad (3Ba).

15. A semiconductor device as set forth in claim 3, wherein one of the two connections (3Ab) electrically connects said pad (3Ba) with said fuse line (3Aa).

16. A semiconductor device as set forth in claim 15, wherein another of the two connections (3Ab) electrically connects another pad (3Bb) with said fuse line (3Aa).

17. A semiconductor device as set forth in claim 16, wherein another conductive layer (5B) within another opening (4A) through said inter-layer insulating film (4) is electrically connected to said another pad (3Bb), the distance (D0) between said conductive layer (5A) and said another conductive layer (5B) is larger than said length (L1).

18. A semiconductor device as set forth in claim 17, wherein said length (L1) is the distance between said pad (3Ba) and said another pad (3Bb).

* * * * *